(12) United States Patent  
Miura et al.

(10) Patent No.: US 11,073,215 B2  
(45) Date of Patent: Jul. 27, 2021

(54) GAS SUPPLY SYSTEM

(71) Applicant: FUJIKIN INCORPORATED, Osaka (JP)

(72) Inventors: Takeru Miura, Osaka (JP); Tomohiro Nakata, Osaka (JP); Toshiyuki Inada, Osaka (JP); Kazunari Watanabe, Osaka (JP); Kenta Kondo, Osaka (JP); Hidenobu Sato, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 33 days.

(21) Appl. No.: 16/618,912

(22) PCT Filed: Jun. 6, 2018

(86) PCT No.: PCT/JP2018/021739  
§ 371 (c)(1),  
(2) Date: Dec. 3, 2019

(87) PCT Pub. No.: WO2019/026417  
PCT Pub. Date: Feb. 7, 2019

(65) Prior Publication Data  
US 2020/0088307 A1    Mar. 19, 2020

(30) Foreign Application Priority Data

Jul. 31, 2017 (JP) .................. JP2017-147513

(51) Int. Cl.  
*F16K 7/16* (2006.01)  
*F16K 31/50* (2006.01)  
*H01L 21/31* (2006.01)

(52) U.S. Cl.  
CPC ............. *F16K 7/16* (2013.01); *F16K 31/50* (2013.01); *H01L 21/31* (2013.01)

(58) Field of Classification Search  
CPC .................. F16K 7/16; F16K 31/50  
(Continued)

(56) References Cited

U.S. PATENT DOCUMENTS 5,669,408 A * 9/1997 Nishino ............... G05D 7/0635  
137/487.5  
5,816,285 A * 10/1998 Ohmi ................... G05D 7/0635  
137/487.5

(Continued)

FOREIGN PATENT DOCUMENTS

CN       102828858 A    12/2012  
CN       104094027 A    10/2014  
(Continued)

OTHER PUBLICATIONS

International Search Report issued in International Patent Application No. PCT/JP2018/021739, dated Aug. 28, 2018 (with English translation).

(Continued)

*Primary Examiner* — Kevin R Barss  
(74) *Attorney, Agent, or Firm* — Greenblum & Bernstein, P.L.C.

(57) ABSTRACT

A gas supply system is provided with an automatic valve that is provided in a flow passage and adjusts a flow rate of process gas supplied to a chamber by automatic opening and closing, and a manual valve that is provided downstream of the automatic valve in the flow path and in immediate vicinity of the chamber and adjusts the flow rate of the process gas by manual opening and closing. The manual valve is a direct diaphragm valve having a diaphragm that is placed and separated on and from a seat in conjunction with a stem and a disk along with opening and closing, and includes a stroke adjusting mechanism that adjusts a valve stroke.

8 Claims, 3 Drawing Sheets

(58) Field of Classification Search
USPC .......................................................... 251/31
See application file for complete search history.

(56) References Cited

U.S. PATENT DOCUMENTS

| | | | |
|---|---|---|---|
| 2010/0090151 A1 | 4/2010 | Tanikawa et al. | |
| 2014/0131607 A1 | 5/2014 | Ehmig et al. | |
| 2014/0326915 A1 | 11/2014 | Kitano et al. | |
| 2020/0088307 A1* | 3/2020 | Miura | F16K 31/50 |
| 2020/0386432 A1* | 12/2020 | Ferraro | G05B 19/042 |

FOREIGN PATENT DOCUMENTS

| | | |
|---|---|---|
| JP | 2005-328063 | 11/2005 |
| JP | 2007-64333 | 3/2007 |
| JP | 2012-189165 | 10/2012 |

OTHER PUBLICATIONS

International Preliminary Report on Patentability issued in International Patent Application No. PCT/JP2018/021739, dated Feb. 4, 2020.

\* cited by examiner

GAS SUPPLY SYSTEM

TECHNICAL FIELD

The present invention relates to a gas supply system, and more particularly to a gas supply system that forms a gas supply system for semiconductor manufacturing equipment.

BACKGROUND ART

In recent semiconductor manufacturing equipment that employs an atomic layer Deposition (ALD) method in process, a direct touch metal diaphragm valve (hereinafter referred to as a diaphragm valve or a direct diaphragm valve) that can be used under high temperatures and can control a minute flow rate of process gas with high accuracy has been used near a chamber as a gas supply reactor (for example, see Patent Document 1).

Such a diaphragm valve is not only excellent in responsiveness and gas replaceability, but also has characteristics close to particle-free by employing a direct seal structure using a diaphragm that is a valve body, so that it can be widely and practically used in fields such as semiconductor manufacturing equipment, chemical industrial facilities and food industrial facilities.

PRIOR ART DOCUMENT

Patent Document

Patent Document 1: Japanese Unexamined Patent Application Publication No. 2007-64333

SUMMARY OF THE INVENTION

Problems to be Solved by the Invention

Such a gas supply system includes a flow passage for supplying process gas from a gas supply source to a chamber, and the flow passage is provided with the above-described diaphragm valve as an automatic valve that adjusts a minute flow rate of the process gas supplied to the chamber with high accuracy by automatic opening and closing. Further, a manual valve for adjusting a flow rate of the process gas by manual opening and closing is provided downstream of the automatic valve in the flow passage and in immediate vicinity of the chamber. This manual valve is used at the time of maintenance in the chamber or at the time of emergency shutoff of the process gas. In particular, in the ALD process, since it is necessary to maintain a volume of the chamber, a maintenance frequency for removing the deposits in the chamber is high. It is therefore essential to provide a manual valve in the immediate vicinity of the chamber.

However, even if a gas flow rate is controlled with high accuracy by the automatic valve described above, the gas flow rate supplied to the chamber may vary due to variations in a flow coefficient (Cv value) based on a difference of the individual manual valves. Accordingly, in a gas supply system in which a manual valve is installed in the immediate vicinity of the chamber, by minimizing an influence on the gas flow rate control caused by the manual valve, it is required to reduce fluctuations in the flow rate characteristics of process gas in the entire gas supply system and to thereby improve an accuracy of the gas flow rate control.

The present invention has been made in view of such problems, and in a gas supply system in which a manual valve is installed in the immediate vicinity of a chamber, an object of the present invention is to provide a gas supply system capable of reducing fluctuations in the flow rate characteristics of process gas in the entire gas supply system, thereby improving an accuracy of the gas flow rate control by minimizing an influence on the gas flow rate control caused by the manual valve.

Means for Solving the Problems

In order to achieve the above object, a gas supply system of the present invention is a gas supply system having a flow passage for supplying process gas from a gas supply source toward a chamber, and includes an automatic valve that is provided in the flow passage and adjusts a flow rate of the process gas supplied to the chamber by automatic opening and closing, and a manual valve that is provided downstream of the automatic valve in the flow path and in immediate vicinity of the chamber and adjusts the flow rate of the process gas by manual opening and closing. The manual valve is a direct diaphragm valve having a diaphragm that is placed and separated on and from a seat in conjunction with a stem and a disk along with opening and closing, and includes a stroke adjusting mechanism that adjusts a valve stroke.

Preferably, the stroke adjusting mechanism adjusts the valve stroke by restricting the stem from moving upwardly when the manual valve is fully opened.

Preferably, the stroke adjusting mechanism adjusts a Cv value of the manual valve by restricting the stem from moving upwardly when the manual valve is fully opened.

Preferably, the manual valve includes a handle for moving the stem upwardly and downwardly and a bonnet nut into which the stem and a disk are placed so as to be movable upwardly and downwardly, and the stroke adjusting mechanism includes a cylindrical stroke adjusting member that is positioned between the bonnet nut and the handle, the cylindrical stroke adjusting member into which the stem is inserted so as to be movable upwardly and downwardly and that is threadedly inserted into the bonnet nut, and a lock nut that is screwed with an outer peripheral surface of the stroke adjusting member and restricts the stroke adjusting member from moving upwardly and downwardly with respect to the bonnet nut.

Preferably, the stroke adjusting mechanism sets the valve stroke based on a threaded amount of the stroke adjusting member with respect to the bonnet nut.

Preferably, the stem includes a stepped portion below a lower end surface of the stroke adjusting member, and the stroke adjusting mechanism restricts the stem from moving upwardly when the manual valve is fully opened by an abutment of the lower end surface of the stroke adjusting member with the stepped portion of the stem.

Preferably, a separation distance between the lower end surface of the stroke adjusting member and the stepped portion of the stem when the manual valve is fully closed is equal to the valve stroke.

Preferably, the stem includes a seal member provided on a distal end portion of the stem, the distal end portion is in contact with an insertion hole of the bonnet nut into which the stem is inserted via the seal member, the stem passes through an insertion hole of the stroke adjusting member, and the stem and the stroke adjusting member are arranged coaxially with each other.

Preferably, the stroke adjusting member includes a first male thread portion, which consists of a fine pitch thread threadedly inserted into the bonnet nut, on an outer peripheral surface of the stroke adjusting member and the stem includes a second male thread portion, which consists of a coarse pitch thread into which the stem is threadedly inserted, on an outer peripheral surface of the stem.

Advantageous Effects of the Invention

In a gas supply system in which a manual valve is installed in the immediate vicinity of a chamber, by minimizing an influence on the gas flow rate control caused by a manual valve, the gas supply system of the present invention makes it possible to reduce the fluctuations in the flow rate characteristics of process gas in the entire gas supply system and to thereby improve an accuracy of the gas flow rate control.

MODE OF CARRYING OUT THE INVENTION

Hereinafter, an embodiment of the present invention will be described with reference to the drawings.

Figure 1:
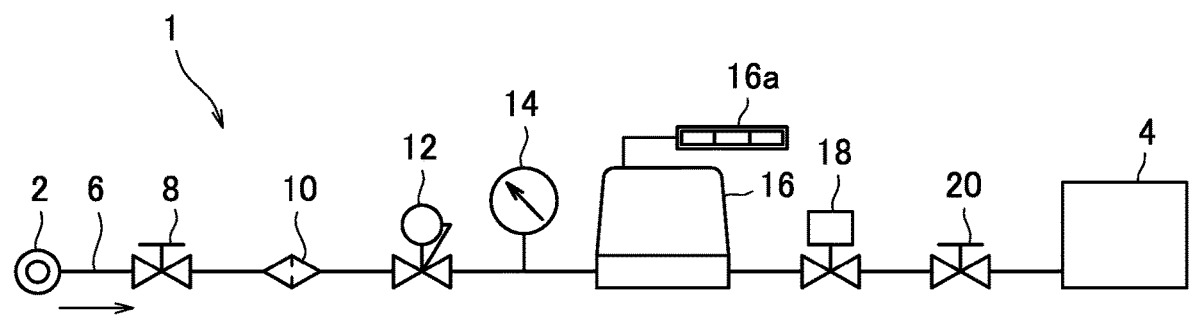
FIG. 1 is a block diagram of a gas supply system according to an embodiment of the present invention.

FIG. 1 shows a block diagram of a gas supply system 1 according to an embodiment of the present invention. The gas supply system 1 includes a flow passage 6 that supplies process gas from a gas supply source 2 toward a chamber 4. In the flow passage 6, a first manual valve 8, a filter 10, a pressure reducing valve 12, a pressure gauge 14, a flow rate controller 16, an automatic valve 18 and a second manual valve (manual valve) 20 are arranged sequentially in a flow direction of the process gas indicated by an arrow.

The gas supply system 1 is used, for example, in a gas supply system for semiconductor manufacturing equipment that employs an atomic layer Deposition (ALD) method in the process. The ALD method is widely used in a film formation process of semiconductor manufacturing because of its good thermal history and step coverage, in which process gas such as a source gas or a liquid source gas is supplied into the chamber 4, thereby forming a film on a surface of a wafer or the like by a chemical reaction. A fine film thickness corresponding to an atomic layer can thus be formed with high accuracy.

The gas supply source 2 is, for example, a tank that stores process gas, and supplies the process gas to the flow passage 6. The first manual valve 8 is a manual on-off valve, and is used to shut off the process gas supplied from the gas supply source 2 to the filter 10 side during maintenance. The filter 10 removes particles and the like contained in the process gas supplied from the gas supply source 2. The pressure reducing valve 12 adjusts the process gas supplied from the gas supply source 2 to a predetermined pressure.

The pressure gauge 14 displays a pressure of the process gas adjusted by the pressure reducing valve 12. The flow rate controller 16 is a mass flow controller, adjusts the process gas flowing to the automatic valve 18 to a predetermined flow rate, and displays the adjusted flow rate on a display 16a. The automatic valve 18 is a so-called furnace port valve provided near the chamber 4 in the flow passage 6 and is an air-driven on-off valve that is automatically opened and closed by pulse control using compressed air pressure. The automatic valve 18 can control a minute flow rate of the process gas in which the flow rate is adjusted by the flow rate controller 16 with high accuracy.

Since the automatic valve 18 is exposed under high temperatures (for example, 150° C. to 400° C.) due to a chemical reaction during film formation in the chamber 4, a direct diaphragm valve that can be used at high temperatures and can control a minute flow rate with high accuracy is employed in the automatic valve 18. This diaphragm valve is excellent in responsiveness and gas replaceability and has characteristics close to particle-free.

The second manual valve 20 is provided downstream of the automatic valve 18 in the flow passage 6 and in the immediate vicinity of the chamber 4, and is exposed to the same high temperatures as those of the automatic valve 18. The second manual valve 20 is an on-off valve that adjusts a flow rate of the process gas supplied to the chamber 4 through the automatic valve 18 by manual opening and closing, and is mainly used at the time of maintenance in the chamber 4 or an emergency shutoff of the process gas.

In particular, in the ALD process, a volume of the chamber 4 needs to be maintained, so that a frequency for removing the deposits in the chamber 4 tends to be high. For this reason, the second manual valve 20 for maintenance of the chamber 4 is provided in the immediate vicinity of the chamber 4 as a so-called final valve. The chamber 4 is a reactor, and is supplied with process gas via the automatic valve 18 and then the second manual valve 20 to form a film on a surface of a wafer or the like by a chemical reaction, thereby forming a fine film thickness corresponding to a single atomic layer with high accuracy.

Here, even if a flow rate of the process gas is controlled with high accuracy by the automatic valve 18, the flow rate of the gas supplied to the chamber 4 may vary due to variations in a flow coefficient (Cv value) based on a difference of the individual second manual valves 20. Accordingly, in the gas supply system 1 in which the manual valve 20 is installed in the immediate vicinity of the chamber 4, by minimizing an influence on gas flow rate control caused by the second manual valve 20, it is required to reduce the fluctuations in the flow rate characteristics of process gas in the entire gas supply system 1 and to thereby improve an accuracy of the gas flow rate control.

Therefore, it is conceivable that the second manual valve 20 is set to a large flow-rate valve (large Cv value) such as a bellows valve. Accordingly, by fully opening the second manual valve 20 at the time of gas flow rate control, when the process gas in which the flow control is performed by the automatic valve 18 flows through the second manual valve 20, a flow passage resistance of the process gas becomes small. For this reason, an influence on the gas flow rate control caused by the second manual valve 20 is minimized, thereby increasing an accuracy of the gas flow rate control in the entire gas supply system 1.

However, a direct diaphragm valve similar to the automatic valve 18 must be used for the second manual valve 20. This is because the gas supply system 1, in particular, the gas supply system 1 of the ALD process is required to use a valve that is excellent in responsiveness and gas replaceability and has characteristics close to particle-free. For this reason, it is not preferable to use a bellows valve or the like that is poor in replaceability and easily deposits particles on the bellows portion.

In addition, due to the layout limitations of the gas supply system 1, it is difficult to secure a large space in the immediate vicinity of the chamber 4, so that a large-size and a large-flow-rate (large Cv value) direct diaphragm valve cannot be installed. For this reason, in the gas supply system 1 of the present embodiment, a small-size and a small-flow-rate direct diaphragm valve (small Cv value) is employed in the second manual valve 20 that is installed in the immediate vicinity of the chamber 4.

Figure 2:
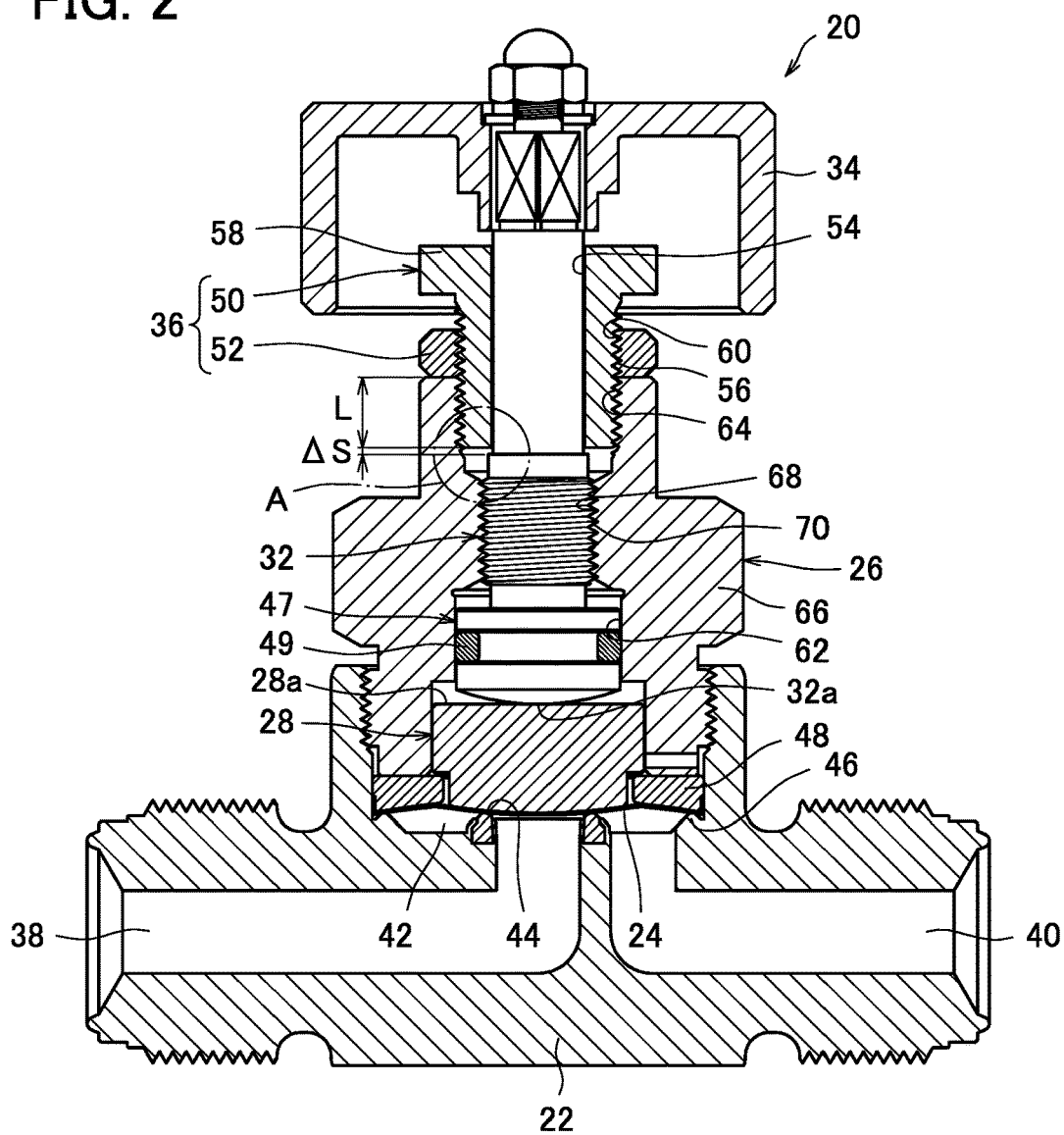
FIG. 2 is a longitudinal sectional view of a second manual valve of FIG. 1 when fully closed.

FIG. 2 shows a longitudinal sectional view of the second manual valve 20 when fully closed. In the following description of FIGS. 2 to 5, an upside of each figure is described as an upper side. The second manual valve 20 of the present embodiment mainly includes a body 22, a diaphragm 24, a bonnet nut 26, a disk 28, a stem 32, a handle 34, and a stroke adjusting mechanism 36. The body 22 is made of a metal material such as stainless steel, and a fluid inlet 38 and a fluid outlet 40 are formed on both sides of the body 22, and an upper-side-opened concave valve chamber 42 that is communicated with the fluid inlet 38 and the fluid outlet 40 is formed on an upper portion of the body 22.

A separate sheet 44 made of synthetic resin is provided in a substantially embedded state at the bottom surface of the valve chamber 42. A step portion 46 is formed at lower side of an inner peripheral surface of the valve chamber 42. The seat 44 may be formed integrally with the body 22. The diaphragm 24 is disposed on the upper side of the seat 44 and maintains an airtightness of the valve chamber 42, while a central portion of the diaphragm 24 moves upwardly and downwardly and is placed and separated on and from the seat 44. The diaphragm 24 is formed in a dish shape having a central portion bulged upward by a thin metal plate such as stainless steel or other shape memory alloy.

A peripheral edge portion of the diaphragm 24 is placed on the step portion 46 of the inner peripheral surface of the valve chamber 42, is pressed toward the step portion 46 side by a lower end portion of the bonnet nut 26, and is clamped and fixed in an airtight state. The bonnet nut 26 is formed in a cylindrical shape, and a lower end portion thereof is inserted into the valve chamber 42 of the body 22 and is screwed and fixed to a cylindrical portion protruding from an upper portion of the body 22. The disk 28 is made of metal such as stainless steel, and is inserted into a lower end portion of the bonnet nut 26 so as to be movable up and down (upwardly and downwardly), and a lower end surface of the disk 28 abuts while pressing an upper surface of the central portion of the diaphragm 24.

The stem 32 is provided with an O-ring (seal member) 49 on an outer peripheral surface of a distal end portion 47 thereof. The stem 32 is threadedly inserted into the bonnet nut 26 so as to be movable up and down such that a lower end surface of the distal end portion 47 can abut on the disk 28. When the second manual valve 20 of FIG. 2 is fully closed, the stem 32 presses the disk 28 downward so that a central portion of the diaphragm 24 is placed on the seat 44.

A handle 34 for operating the stem is fixed to an upper end portion of the stem 32. An annular stopper member 48 is interposed between an upper surface of the peripheral edge portion of the diaphragm 24 and a lower end surface of the bonnet nut 26. When the second manual valve 20 is fully closed, the central portion of the diaphragm 24 is placed on the seat 44, and thus the stopper member 48 restricts the stem 32 from moving downwardly.

Here, the second manual valve 20 of the present embodiment is configured such that a stroke of the stem 32 can be adjusted by the stroke adjusting mechanism 36. The stroke adjusting mechanism 36 includes a cylindrical stroke adjusting member 50 positioned between the bonnet nut 26 and the handle 34, and an annular lock nut 52 that is screwed with an outer peripheral surface of the stroke adjusting member 50.

Specifically, the stroke adjusting member 50 includes an insertion hole 54 into which the stem 32 is inserted so as to be movable up and down, a male thread portion (first male thread portion) 56 formed on an outer peripheral surface of the stroke adjusting member 50, and an enlarged diameter portion 58 formed on an upper portion of the stroke adjusting member 50. The stem 32 passes through the insertion hole 54 of the stroke adjusting member 50, and the stem 32 and the stroke adjusting member 50 are arranged coaxially with each other.

The male thread portion 56 consists of a fine pitch thread having a smaller thread pitch and more threads than a general coarse pitch thread. A female thread portion 60 is formed on an inner peripheral surface of the lock nut 52, and the female thread portion 60 is screwed with the male thread portion 56 of the stroke adjusting member 50 between the bonnet nut 26 and the enlarged diameter portion 58.

Meanwhile, the bonnet nut 26 includes an insertion hole 62 into which the stem 32 is inserted so as to be movable up and down via the O-ring 49, a female thread portion 64 formed on an upper portion of the inner peripheral surface of the insertion hole 62, an enlarged diameter portion 66 formed below the female thread portion 64, and a female thread portion 68 that is formed on an inner peripheral surface of the enlarged diameter portion 66 and into which the stem 32 is threadedly inserted. In the insertion hole 62 of the bonnet nut 26, the stem 32 is held in the axial direction by the O-ring 49. Further, the stem 32 is formed with a male thread portion (second male thread portion) 70 with which the female thread portion 68 is screwed on the outer peripheral surface. The male thread portion 70 consists of a general coarse pitch thread.

Hereinafter, a procedure for setting a valve stroke ΔS of the second manual valve 20 will be described.

First, the male thread portion 56 of the stroke adjusting member 50 is threadedly advanced to the female thread portion 64 of the bonnet nut 26. The threaded amount at this time is L. Next, the female thread portion 60 of the lock nut 52 is threadedly advanced to the male thread portion 56 of the stroke adjusting member 50 until a lower end surface of the lock nut 52 abuts on an upper end surface of the bonnet nut 26. Then, by tightening the lock nut 52 with a predetermined torque, the upward and downward movement of the stroke adjusting member 50 with respect to the bonnet nut 26 is restricted and locked. The valve stroke ΔS of the second manual valve 20 is set in this way.

When the second manual valve 20 is to be a closed state, the handle 34 is turned, and the male thread portion of the stem 32 is threadedly advanced to the female thread portion 68 of the bonnet nut 26 to be moved downwardly. As a result, as shown in FIG. 2, a lower end 32a of the stem 32 abuts on an upper end surface 28a of the disk 28. Then, the disk 28 moves downwardly and pushes down the central portion of the diaphragm 24 to elastically deform the diaphragm 24, and is placed on the seat 44 to fully close the second manual valve 20. Since the stem 32 is restricted from moving downwardly by the stopper member 48, the diaphragm 24 is prevented from being damaged or broken due to overtightening of the handle 34.

Figure 3:
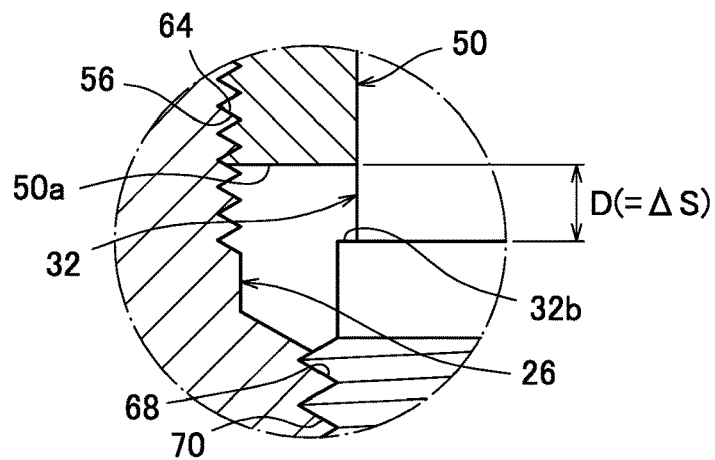
FIG. 3 is an enlarged view of a region A of FIG. 2.

FIG. 3 is an enlarged view of a region A of FIG. 2. In the stem 32, a stepped portion 32b is formed by gradually reducing a diameter of the upper side from the portion where the male thread portion 70 is formed. In the fully closed state of the second manual valve 20, a lower end surface 50a of the stroke adjusting member 50 and the stepped portion 32*b* of the stem 32 are separated by a separation distance D because the stem 32 has moved downwardly, and this separation distance D is defined as the valve stroke ΔS described above.

As described above, the valve stroke ΔS can be adjusted by adjusting the threaded amount L of the male thread portion 56 of the stroke adjusting member 50 with respect to the female thread portion 64 of the bonnet nut 26. Specifically, increasing the threaded amount L decreases the separation distance D, thereby decreasing the valve stroke ΔS, and decreasing the threaded amount L increases the separation distance D, thereby increasing the valve stroke ΔS.

Figure 4:
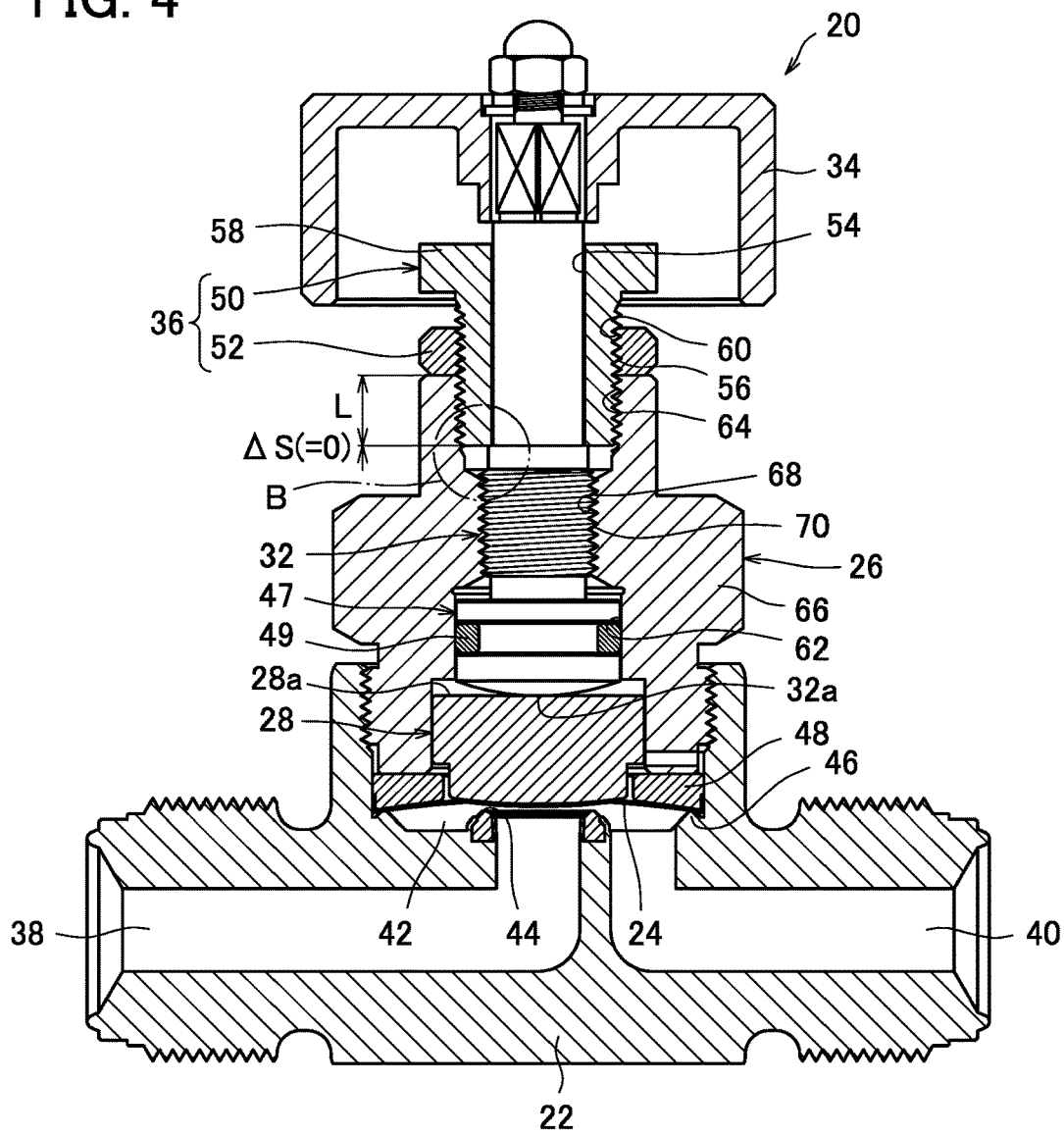
FIG. 4 is a longitudinal sectional view of the second manual valve of FIG. 1 when fully opened.

FIG. 4 is a longitudinal sectional view of the second manual valve 20 when fully opened. When the second manual valve 20 is fully opened, the handle 32 is turned to move the stem 32 upwardly. As a result, as shown in FIG. 4, the diaphragm 24 is restored to its original shape while pushing up the disk 28 by its elastic force or by gas pressure at the fluid inlet 38, and is separated from the seat 44 to fully open the second manual valve 20.

Figure 5:
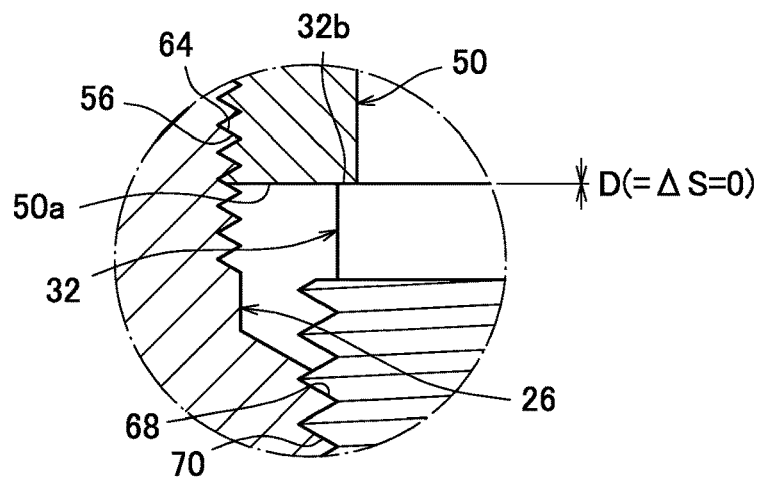
FIG. 5 is an enlarged view of a region B of FIG. 4.

FIG. 5 is an enlarged view of a region B of FIG. 4. In the fully opened state of the second manual valve 20, the stepped portion 32*b* of the stem 32 abuts on the lower end surface 50*a* of the stroke adjusting member 50 because the stem 32 has moved upwardly. As a result, the separation distance D becomes zero. Thus, when the second manual valve 20 is fully opened, the stepped portion 32*b* of the stem 32 abuts on the lower end surface 50*a* of the stroke adjusting member 50, and whereby the stroke adjusting member 50 restricts the stem 32 from moving upwardly.

As described above, in the gas supply system 1 of the present embodiment, the stroke adjusting mechanism 36 that adjusts the valve stroke ΔS is provided in the second manual valve 20 installed in the immediate vicinity of the chamber 4. As a result, the variations in the Cv value based on the difference of the individual second manual valves 20 can be adjusted by the stroke adjusting mechanism, 36. Therefore, in the gas supply system 1 in which the second manual valve 20 is installed in the immediate vicinity of the chamber 4, by minimizing an influence on the gas flow rate control caused by the second manual valve 20, it is possible to reduce fluctuations in the gas flow rate characteristics of process gas in the entire gas supply system 1 and to thereby increase an accuracy of the gas flow rate control.

In addition, in the present embodiment, a direct diaphragm valve having a diaphragm 24 that is placed and separated on and from the seat 44 in conjunction with the stem 32 and the disk 28 along with opening and closing is employed in the second manual valve 20. As a result, an accuracy of the gas flow rate control in the entire gas supply system 1 is increased while satisfying the required specifications such as cleanliness of the process to which the gas supply system 1 is applied and the requirements on the layout limitations of the gas supply system 1 such that only a small space can be secured.

Specifically, the stroke adjusting mechanism 36 adjusts the valve stroke ΔS by restricting the stem 32 from moving upwardly when the second manual valve 20 is fully opened, and furthermore adjusts the Cv value of the second manual valve 20. The upward restriction of the stem 32 when the second manual valve 20 is fully opened is performed by an abutment of the lower end surface 50*a* of the stroke adjusting member 50 with the stepped portion 32*b* of the stem 32. Therefore, at the time of gas flow rate control, the gas flow rate control in the automatic valve 18 can be performed with high accuracy in consideration of the Cv value when the second manual valve 20 is fully opened.

The stroke adjusting mechanism 36 is positioned between the bonnet nut 26 and the handle 34, and includes the cylindrical stroke adjusting member 50 into which the stem 32 is inserted so as to be movable up and down and that is threadedly inserted into the bonnet nut 26, and the lock nut 52 that is screwed with the outer peripheral surface of the stroke adjusting member 50 and restricts the upward and downward movement of the stroke adjusting member with respect to the bonnet nut 26. Therefore, the stroke adjusting mechanism 36 can be realized with a simple configuration in which only the stroke adjusting member 50 and the lock nut 52, which are separate members from the stem 32, are provided.

Further, the stroke adjusting mechanism 36 only adjusts the threaded amount L of the stroke adjusting member 50 with respect to the bonnet nut 26 and furthermore adjusts the separation distance D between the lower end surface 50*a* of the stroke adjusting member 50 and the stepped portion 32*b* of the stem 32. With this simple operation, the valve stroke ΔS can be set.

Further, the distance D between the lower end surface 50*a* of the stroke adjusting member 50 and the stepped portion 32*b* of the stem 32 when the second manual valve 20 is fully closed is equal to the valve stroke ΔS. As a result, the valve stroke ΔS adjusted by the threaded amount L of the stroke adjusting member 50 can be easily recognized, so that the valve stroke ΔS can be adjusted more easily.

Further, the O-ring 49 is attached to the distal end portion 47 of the stem 32, and the distal end portion 47 comes into contact with the insertion hole 62 of the bonnet nut 26 via the O-ring 49 when the stem 32 moves upwardly and downwardly. This prevents particles generated when the male thread portion 70 of the stem 32 is threadedly advanced to the female thread portion 68 of the bonnet nut 26 from being mixed into the valve chamber 42 by the O-ring 49.

Further, the distal end portion 47 of the stem 32 comes in contact with the insertion hole 62 of the bonnet nut 26 via the O-ring 49. As a result, when the second manual valve 20 is opened and closed, the stem 32 is held in the axial direction in the insertion hole 62, thereby preventing the stem 32 from being swung. Therefore, the flow rate fluctuation at the time of the gas flow rate control is prevented, thereby improving the accuracy of the gas flow rate control can be improved.

The stem 32 passes through the insertion hole 54 of the stroke adjusting member 50, and the axes of the stem and the stroke adjusting member 50 are arranged coaxially with each other. As a result, the stem 32 is held in the axial direction in the insertion hole 54 of the stroke adjusting member 50. Therefore, even when the second manual valve 20 is installed inclined with respect to the horizontal direction, the axis of the stem 32 does not deviate from the axis of the insertion hole 54, which means that the lower end 32*a* of the stem 32 can be vertically brought into contact with the disk 28. Thus, the gas flow rate control can be performed with high accuracy.

Further, the male thread portion 56 of the stroke adjusting member 50 consists of a fine pitch thread having a smaller thread pitch and more threads than a general coarse pitch thread, whereas the male thread portion 70 of the stem 32 consists of a coarse pitch thread. Therefore, the opening and closing operation of the second manual valve 20 can be performed quickly and smoothly, while the valve stroke ΔS can be adjusted with high accuracy.

This is the end of the description of the embodiment of the present invention. However, the present invention is not limited to this, and various modifications can be made without departing from the spirit of the present invention. For example, the components of the gas supply system 1 of the present invention are not strictly limited to the above-described configuration. Further, the gas supply system 1 can be applied not only to semiconductor manufacturing equipment employing the process other than the ALD process, but also to gas supply systems for various processes such as chemical industry facilities and food industry facilities.

Further, the stroke adjusting mechanism 36 is not strictly limited to the above-described configuration, and there is no particular limitation as long as the valve stroke ΔS can be adjusted in the second manual valve 20 that is a direct diaphragm valve. Therefore, an influence on the gas flow rate control caused by the second manual valve 20 is minimized, thereby increasing an accuracy of the gas flow rate control in the entire gas supply system 1.

EXPLANATION OF REFERENCE SIGNS

1 Gas supply system
2 Gas supply source
4 Chamber
6 Flow passage
18 Automatic valve
20 Second manual valve (manual valve, direct diaphragm valve, diaphragm valve)
24 Diaphragm
26 Bonnet nut
28 Disk
32 Stem
32b Stepped portion
34 Handle
36 Stroke adjusting mechanism
44 Seat
47 Distal end portion
49 O-ring (seal member)
50 Stroke adjusting member
50a Lower end surface
52 Lock nut
54 Insertion hole of stroke adjusting member
56 Male thread portion (first male thread portion)
62 Insertion hole of bonnet nut
70 Male thread portion (second male thread portion)

The invention claimed is:

1. A gas supply system having a flow passage for supplying process gas from a gas supply source toward a chamber, the system comprising:
    an automatic valve that is provided in the flow passage and adjusts a flow rate of the process gas supplied to the chamber by automatic opening and closing; and
    a manual valve that is provided downstream of the automatic valve in the flow passage and in immediate vicinity of the chamber, and adjusts the flow rate of the process gas by manual opening and closing, wherein
    the manual valve is a direct diaphragm valve having a diaphragm that is placed and separated on and from a seat in conjunction with a stem and a disk along with opening and closing, and includes a stroke adjusting mechanism that adjusts a valve stroke,
    wherein the manual valve includes:
        a handle for moving the stem upwardly and downwardly; and
        a bonnet nut into which the stem is threadedly inserted, wherein the stroke adjusting mechanism includes:
            a cylindrical stroke adjusting member that is positioned between the bonnet nut and the handle, and the cylindrical stroke adjusting member into which the stem is inserted so as to be movable upwardly and downwardly and that is threadedly inserted into the bonnet nut; and
            a lock nut that is screwed with an outer peripheral surface of the cylindrical stroke adjusting member and restricts the cylindrical stroke adjusting member from moving upwardly and downwardly with respect to the bonnet nut.

2. The gas supply system according to claim 1, wherein the stroke adjusting mechanism adjusts the valve stroke by restricting the stem from moving upwardly when the manual valve is fully opened.

3. The gas supply system according to claim 2, wherein the stroke adjusting mechanism adjusts a Cv value of the manual valve by restricting the stem from moving upwardly when the manual valve is fully opened.

4. The gas supply system according to claim 1, wherein the stroke adjusting mechanism sets the valve stroke based on a threaded amount of the cylindrical stroke adjusting member with respect to the bonnet nut.

5. The gas supply system according to claim 4, wherein
    the stem includes a stepped portion below a lower end surface of the cylindrical stroke adjusting member, and
    the stroke adjusting mechanism restricts the stem from moving upwardly when the manual valve is fully opened by an abutment of the lower end surface of the cylindrical stroke adjusting member with the stepped portion of the stem.

6. The gas supply system according to claim 5, wherein a separation distance between the lower end surface of the cylindrical stroke adjusting member and the stepped portion of the stem when the manual valve is fully closed is equal to the valve stroke.

7. The gas supply system according to claim 1, wherein
    the stem includes a seal member provided on a distal end portion of the stem,
    the distal end portion is in contact with an insertion hole of the bonnet nut into which the stem is inserted via the seal member,
    the stem passes through an insertion hole of the cylindrical stroke adjusting member, and
    the stem and the cylindrical stroke adjusting member are arranged coaxially with each other.

8. The gas supply system according to claim 1, wherein
    the cylindrical stroke adjusting member includes a first male thread portion, which consists of a fine pitch thread threadedly inserted into the bonnet nut, on the outer peripheral surface of the cylindrical stroke adjusting member, and
    the stem includes a second male thread portion, which consists of a coarse pitch thread into which the stem is threadedly inserted, on an outer peripheral surface of the stem.

* * * * *